United States Patent [19]

Hasegawa et al.

[11] Patent Number: 4,740,252

[45] Date of Patent: Apr. 26, 1988

[54] SOLDER PASTE FOR ELECTRONIC PARTS

[75] Inventors: Eietsu Hasegawa, Satte; Rikiya Kato, Souka, both of Japan

[73] Assignee: Senju Metal Industry Co., Ltd., Tokyo, Japan

[21] Appl. No.: 9,979

[22] Filed: Feb. 2, 1987

[30] Foreign Application Priority Data

Jan. 31, 1986 [JP] Japan .................... 61-18187

[51] Int. Cl.$^4$ .................... B23K 35/34; B22F 1/00
[52] U.S. Cl. ......................... 148/24; 75/255
[58] Field of Search ............... 75/255; 148/24

[56] References Cited

U.S. PATENT DOCUMENTS 4,039,329  8/1977  Youdelis ................ 75/255
4,478,638 10/1984  Smith ................... 75/255
4,483,905 11/1984  Engstrom ............... 75/255

Primary Examiner—Peter D. Rosenberg
Attorney, Agent, or Firm—Sughrue, Mion, Zinn, Macpeak, and Seas

[57] ABSTRACT

A solder paste comprises a solder paste portion containing powdered solder and metallic spheres which are made of a material having a higher melting point than the solder paste portion and whose surface can be wet by molten solder. The metallic spheres have a diameter of 0.07–0.3 mm. The metallic spheres can comprise a single metal or two metals, one of which forms the center of the sphere and the second of which is plated on the surface of the first.

7 Claims, 2 Drawing Sheets

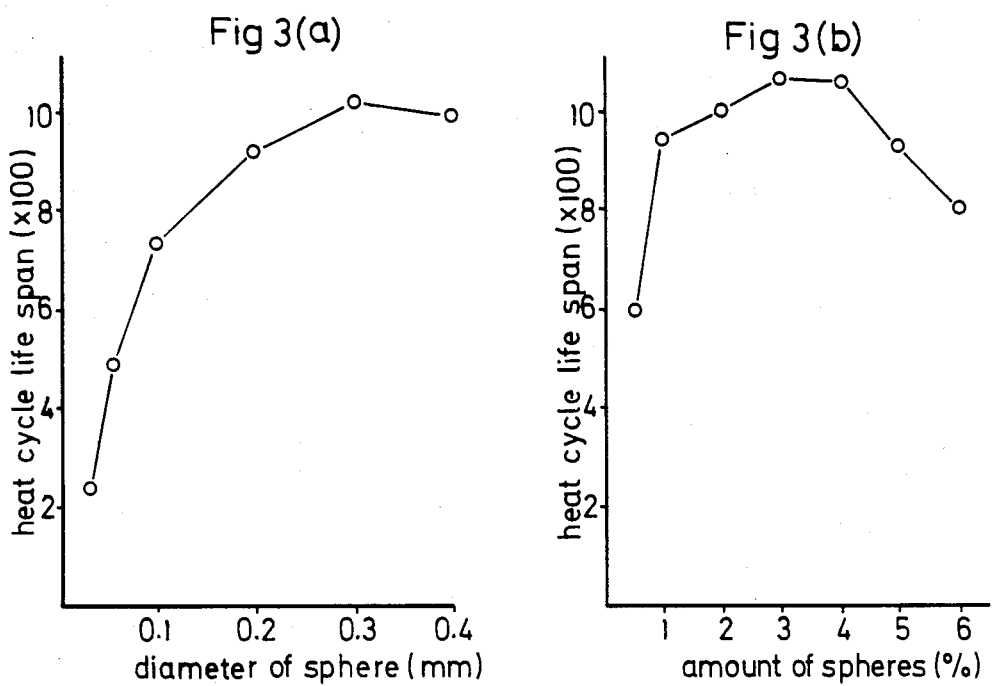

SOLDER PASTE FOR ELECTRONIC PARTS

BACKGROUND OF THE INVENTION

This invention relates to a solder paste, and more particularly to a solder paste for the soldering of electronic parts in an electronic apparatus.

Recently, solder paste has come to be widely used for mounting electronic parts such as semiconductor chips on printed circuit boards or heat sinks. Generally, solder paste contains powdered solder comprising an Sn-Pb alloy. In order to minimize the effects of heat on the parts when they are being soldered, a solder composition of 63% Sn-Pb is commonly used since it has a low melting point (183° C.) compared to other Sn-Pb alloys in addition to excellent solderability. However, for parts which are subjected to higher temperatures during the operation of an electronic apparatus, such as parts equipped with a heat sink, a solder paste containing powdered solder with a higher melting point may be used, such as a 55% Sn-Pb solder with a melting point of 310° C. or a 5% Ag-Pb solder with a melting point of 365° C.

When an electronic part such as a semiconductor chip is soldered to a supporting member such as printed circuit board using solder paste, a suitable amount of the solder paste is applied to the printed circuit board in selected locations by a printing process such as screen printing or by blowing the solder from a dispenser. The semiconductor chip is then placed atop the solder paste. The printed circuit board with the chip resting thereon is then placed into a reflow furnace or an infrared heating apparatus so as to melt the solder paste and solder the chip to the printed circuit board. A similar method is used for soldering an electronic part to a heat sink.

However, the peeling strength of a soldered connection made using a conventional solder paste is low, and even a small shock may cause electronic parts to come loose from the supporting members. Furthermore, during the operation of an apparatus containing electronic parts which are soldered using solder paste, cracks often form in the solder which not only result in inadequate electrical contact but may also cause the parts to come loose from the supporting members.

SUMMARY OF THE INVENTION

It is an object of the present invention to provide a solder paste for the soldering of electronic parts which must have a high peeling strength.

It is another object of the present invention to provide a solder paste for electronic parts which does not develop cracks during the operation of an electronic apparatus.

It is yet another object of the present invention to provide a solder paste for electronic parts which makes it easy to mount an electronic part on a supporting member so that the part is level with respect to the surface of the supporting member.

As a result of investigations of the cause of the above-described drawbacks of conventional solder pastes, the present inventors discovered that the peeling strength of a solder paste for electronic parts is dependent on the clearance between the electrodes of the electronic part and a mount for the electronic part on a supporting member such as a printed circuit board or a heat sink. If the clearance is too small, the amount of solder between the electrodes and the mount is inadequate, resulting in a low peeling strength. The peeling strength is also decreased when the clearance is too large. Furthermore, it was found that poor peeling strength is also due to the presence of voids formed by flux fumes or air which remain in the solder after soldering.

The formation of cracks, on the other hand, is caused by thermal stresses which are exerted on solder. Namely, during the operation of an electronic apparatus, electronic parts undergo repeated thermal expansion and contraction due to the heating of the parts when current is passing therethrough and due to the cooling which takes place when the current is stopped. Due to the difference in the coefficients of thermal expansion of electronic parts such as semiconductor chips and the supporting members to which they are soldered, the repeated heating and cooling generates thermal stresses in the solder, and if a layer of solder paste connecting an electronic part to a supporting member is too thin, or if it is of nonuniform thickness so that the electronic parts is not level with respect to the surface of the supporting member, the thermal stresses are too great for the solder and it undergoes cracking.

In light of these findings, it is apparent that in order for a solder paste to have satisfactory peeling strength and resistance to cracking, the size of the clearance between an electronic part and a supporting member to which it is soldered must be within a certain range, the clearance must be uniform over the area of the electronic part, and the formation of voids in the solder must be prevented.

The present inventors found that a solder paste which meets all of these requirements can be obtained by mixing metallic spheres having a higher melting point than solder with a conventional powdered solder. Provided that the metallic spheres are of a uniform and suitable diameter and are mixed in the solder in the correct proportion, they ensure the suitable clearance between an electronic part and a supporting member and enable the part to be mounted so that it is level with respect to the surface of the supporting member. Furthermore, if the surfaces of the metallic spheres can be wet by molten solder, the metallic spheres prevent the formation of voids in the solder.

Accordingly, a solder paste according to the present invention comprises a solder portion containing powdered solder and a flux, and metallic spheres which are made of a material having a higher melting point than the solder portion and whose surfaces can be wet by molten solder. The metallic spheres have a diameter of 0.07-0.3 mm and constitute approximately 0.5-5 weight % of the solder paste. The metallic spheres can be formed of a single metal, or they can be each formed of two metals, the first metal constituting the center of the sphere and the second metal being plated on the surface of the first metal.

In the past, a number of solders which contain particles of a metal having a higher melting point than solder have been proposed. Japanese patent publication No. 47-28307(1972) discloses a solder for the purpose of filling large gaps, the solder comprising a mixture of powdered solder and a metal powder having a high melting point. When the powdered solder is heated and melts, the molten solder connects the particles of the metal powder with one another and prevents the metal powder from moving. At the same time, the molten solder fills in the openings between the particles of metal powder and is prevented from flowing out of a large gap in which it is applied. Therefore, the metal powder should be as fine as possible (64 microns or finer). The solder is not solder paste, but must contain at least 5 weight % of the metal powder. Moreover, in order to prevent the particles of metal powder from slipping against one another, the particles of metal powder are preferably irregular in shape. Thus, the use of metal powder in the manner disclosed in that invention does not improve the peeling strength or prevent the formation of cracks.

Japanese Laid-Open patent application No. 59-215294(1984) also discloses a solder material comprising solder and particles of a material having a higher melting point than the solder. This reference states "soldering material" but not "paste solder". The particles can be made of a solder having a high melting point or of a metal such as copper. By suitably selecting the particle diameter, any desired clearance between an electronic part and a supporting member to which the part is soldered can be achieved by exerting a force on the part during soldering so that the clearance equals the diameter of the particles. While that invention discloses a method of maintaining a desired clearance, it does not address the problem of the low peeling strength or cracking of solder pastes.

BRIEF DESCRIPTION OF THE DRAWINGS

FIG. 3 (a) and FIG. 3 (b) are graphs showing the influences of the sphere diameter and the content thereof of the paste solder on the heat cycle life span.

DESCRIPTION OF THE PREFERRED EMBODIMENTS

Figure 1A:
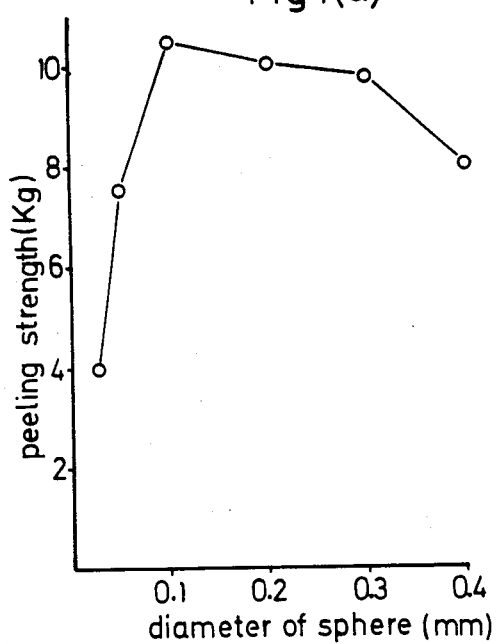
FIG. 1 (a) and FIG. 1 (b) are graphs showing the influences of the sphere diameter and the content thereof of the paste solder on peeling strength.
Figure 1B:
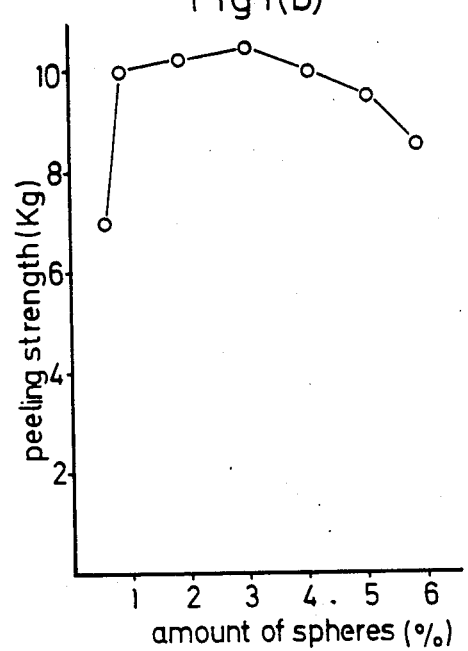
Figure 2A:
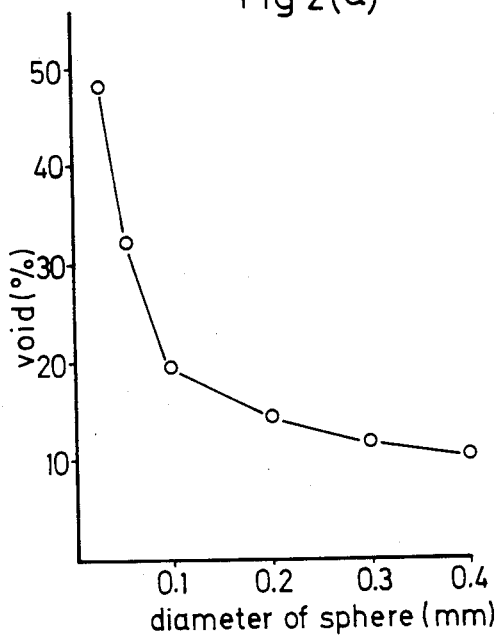
FIG. 2 (a) and FIG. 2 (b) are graphs showing the influences of the sphere diameter and the content thereof of the paste solder on the formation of voids.
Figure 2B:
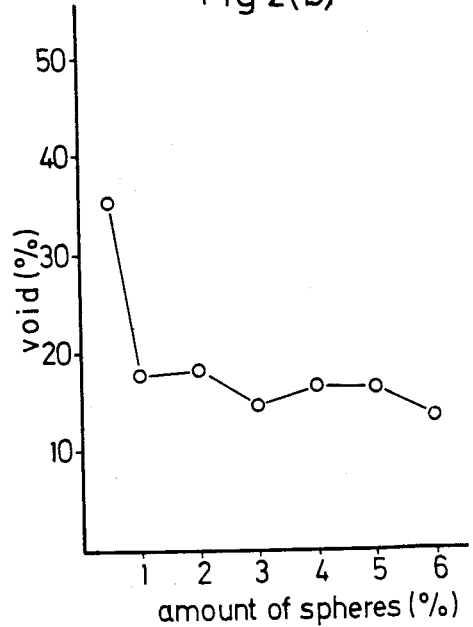

A solder paste according to the present invention comprises a mixture of metallic spheres and a solder portion containing powdered solder and a flux. The metallic spheres which are employed in the present invention are made of a material having a melting point which is sufficiently higher than that of the powdered solder so as not to melt during the soldering porcess in which the powdered solder is melted. Furthermore, it is mandatory that the surface of the metallic spheres be wettable by molten solder. If the surface is wettable by molten solder, flux fumes and residual air can pass around the spheres and escape to the outside of the molten solder, but if the surface is not wettable, these gases remain in the solder to form voids, and the metallic spheres themselves are rejected by the molten solder and segregation occurs, preventing the spheres from producing the desired effect. Some examples of common metals which can be wet by molten solder are Ag, Ni, and Cu. Ag or Ni can be used alone to form the metallic spheres, but Cu can not, because even though it has a higher melting point than powdered solder, when it contacts molten solder, it disperses, and after soldering, a Cu-Sn intermetallic compound forms due to heat aging. This compound is hard and extremely brittle, so that any stresses applied thereto cause it to crack. Therefore, if the metallic spheres are made of Cu, it is advisable to form a plating of Ni on the surface so as to make the surface wettable. As long as the surfaces of the spheres are coated with a plating of a material such as Ni which is wettable by solder, any metal having a sufficiently high melting point can be used for the spheres even if the metal itself is not wettable by molten solder or if it rusts in a solder paste.

The present inventors found that in order to prevent a decrease in peeling strength and cracking of solder, the optimal clearance between an electronic part and the supporting member to which is soldered is 0.07–0.3mm. Accordingly, the diameter of the metallic spheres is defined as being whithin the range of 0.07–0.3mm. If the sphere diameter is less than 0.07 mm, the peeling strength decreases and residual air and flux fumes can not escape to the outside of the molten solder, resulting in voids. On the other hand, if the sphere diameter is greater than 0.3 mm, the peeling strength decreases. The diameter is preferably 0.1–0.3 mm.

The quantity of metallic spheres in the solder paste is also an important factor. If the metallic spheres constitute less than about 0.5 weight % of the solder paste, there will be too few spheres in the soldered portion and the desired effect will not be produced. On the other hand, if the spheres constitute more than about 5 weight % of the solder paste, the peeling strength of the solder will decrease. The amount of the spheres is preferably 1–4 weight %.

The solder portion of a solder paste according to the present invention comprises a conventional powdered solder used for electronic parts, such as a 63% Sn-Pb solder, a 55% Sn-Pb solder, or a 5% Ag-Pb solder together wth a flux such as a conventional rosin flux.

In order to solder electronic parts using a solder paste according to the present invention, a thin layer of the solder paste is applied to a supporting member such as a printed circuit board or a heat sink by a conventional method and then an electronic part is placed on the layer of solder paste. The solder is then melted in a reflow furnace or other heating apparatus. In order for the solder to exhibit the desired effect of maintaining the proper clearance between the electronic part and the supporting member, a force should be exerted on the electronic part in the direction normal to the surface of the supporting member. By pressing the electronic part against the supporting member in this manner, the clearance between the two will be reduced to exactly the diameter of the metallic spheres and the electronic part will be level with respect to the surface of the supporting member.

A solder paste according to the present invention will now be described in further detail by means of the following working examples, which are presented solely for illustrative purposes and do not limit the invention in any way.

EXAMPLE

Solder pastes having the compositions shown in Table 1 were prepared by mixing powdered solder, rosin flux (solder paste flux) , and metallic spheres or metal powder. The resulting solder pastes were then used to solder semiconductor chips to printed circuit boards, which were used as test specimens. After soldering, tests were performed to evaluate the following characteristics of the soldered portion of the test specimens.

(A) Mounting Condition—The soldered portion between the chip and the printed circuit board of each specimen was cut lengthwise in two along a plane parallel to the printed circuit board. The surface of cutting was then polished and observed with a microscope to see if the clearance was uniform over the area of the chip. A uniform clearance indicated that the chip was well mounted and level with respect to the surface of the printed circuit board, while lack of uniformity indicated that the chip was poorly mounted and sloped.

(B) Clearance—The degree of variation in the clearance among the test specimens was evaluated based on the microscopic observations made in (A).

(C) Peeling Strength—A hole was formed in each printed circuit board beneath the chip, the printed circuit board was secured in a jig, and the push portion of a tensile test jig was inserted into the hole. Pressure was exerted by the push portion against the chip until it was peeled off the circuit board. The force in kilograms necessary to produced peeling was measured.

(D) Amount of Voids (%)—After peeling a chip off a printed circuit board in the manner described in (C), the surface of the soldered portion was observed to determine the amount of voids.

(E) Heat Cycle Life Span—Test specimens were repeatedly subjected to a heating and cooling cycle ($-55°$ $125°$ C.). The life span equalled the number of cycles before a crack formed in the soldered portion.

The results of these tests are shown in Table 2.

TABLE 1

SOLDER PASTE COMPOSITION

| EXAMPLE NUMBER | COMPOSITION | | |
| --- | --- | --- | --- |
| PRESENT INVENTION | | | |
| 1 | 63% Sn—Pb powder (325 mesh) | 90 weight % | 98 weight % |
|   | Solder paste flux | 10 weight % | |
|   | Ag spheres (diameter: 0.1 mm) | | 2 weight % |
| 2 | 63% Sn—Pb powder (325 mesh) | 88 weight % | 97 weight % |
|   | Solder paste flux | 12 weight % | |
|   | Ag spheres (Ni plating, diameter: 0.2 mm) | | 3 weight % |
| 3 | 63% Sn—Pb powder (325 mesh) | 90 weight % | 99 weight % |
|   | Solder paste flux | 10 weight % | |
|   | Fe spheres (Ni plating, diameter: 0.3 mm) | | 1 weight % |
| 4 | 5% Sn—Pb powder (325 mesh) | 90 weight % | 98 weight % |
|   | Solder paste flux | 10 weight % | |
|   | Ni spheres (diameter: 0.2 mm) | | 2 weight % |
| COMPARATIVE EXAMPLES | | | |
| 1 | 63% Sn—Pb powder (325 mesh) | 90 weight % | 98 weight % |
|   | Solder paste flux | 10 weight % | |
|   | Ag powder (irregular grains, 250 mesh) | | 2 weight % |
| 2 | 63% Sn—Pb powder (325 mesh) | 90 weight % | 98 weight % |
|   | Solder paste flux | 10 weight % | |
|   | W spheres (diameter: 0.3 mm) | | 2 weight % |
| 3 | 63% Sn—Pb powder (325 mesh) | 90 weight % | 98 weight % |
|   | Solder paste flux | 10 weight % | |
|   | Ni spheres (diameter: 1 mm) | | 2 weight % |

NOTE: The solder paste flux comprises:
Polymeric Rosin: 61.5 weight %,
Hydrogenated Caster Oil: 2.5 weight %,
Diphenylguanidine HBr: 1.0 weight %,
Carbinol: 35 weight %.

TABLE 2

TEST RESULTS

| Example No. | Mounting Condition | Clearance | Peeling Strength (Kg) | Voids (%) | Heat Cycle Life Span (cycles) |
| --- | --- | --- | --- | --- | --- |
| PRESENT INVENTION | | | | | |
| 1 | Level | Uniform | 6.8 | 16 | 210 |
| 2 | Level | Uniform | 5.4 | 13 | 330 |
| 3 | Level | Uniform | 4.4 | 8 | 420 |
| 4 | Level | Uniform | 5.6 | 12 | 340 |
| COMPARATIVE EXAMPLES | | | | | |
| 1 | Sloped | Non-uniform | 6.6 | 32 | 39 |
| 2 | Level | Uniform | 4.3 | 21 | 130 |
| 3 | Level | Uniform | 1.7 | 6 | 90 |

As can be seen from the results for the Comparative Examples in Table 2, the mere addition of metallic particles having a high melting point does not produce the results which are provided by the present invention. In Comparative Example 1, the metallic particles were irregular in shape, with the result that the chips were poorly mounted, the clearance was ununiform, the percentage of voids was high, and the life span before cracking took place was enormously decreased. In the case of Comparative Example 2, although the metallic spheres fell into the size range of the present invention, they were not made of a material which is wettable by molten solder, with the result that the peeling strength was fairly low, the percentage of voids was high, and the life span was very short. In Comparative Example 3, the diameter of the metallic spheres was too large, and accordingly the peeling strength and the life span were both extremely poor.

In contrast, the examples of the present invention all produced a good mounting condition without any sloping of the semiconductor chips, uniform clearance amoung test specimens, a high peeling strength, a low percentage of voids, and a remarkably increased heat cycle life span.

In order to determine the influences of the sphere diameter and amount thereof in the paste solder on the soldering of the paste solder of the present invention, Example No. 1 was repeated with the diameter of the metallic spheres and the content thereof in the paste solder being varied.

The peeling strength, formation of voids and heat cycle life span were examined for the resulting soldered portions.

The test results are summarized by graphs in FIGS. 1(a) and (b) through FIGS. 3(a) and (b).

As is apparent therefrom, the sphere diameter of 0.07–0.3 mm and the metal sphere content of 0.5 to 5.0 weight % are critical to the present invention.

Although the invention has been described with preferred embodiments it is to be understood that variations and modifications may be employed without departing from the concept of the invention as defined in the following claims.

What is claimed is:

1. A solder paste for the soldering of electronic parts comprising:
   approximately 99.5 weight % to approximately 95 weight % of a solder paste portion comprising a powdered solder and a flux; and
   approximately 0.5 weight % to approximately 5 weight % of metallic spheres which are made of a material having a higher melting point than said powdered solder and whose surfaces can be wet by molten solder and which have a diameter of 0.07–0.3 mm.

2. A solder paste as claimed in claim 1, wherein each of said metallic spheres is made of a single metal.

3. A solder paste as claimed in claim 2, wherein said single metal is selected from Ag and Ni.

4. A solder paste as claimed in claim 1, wherein each of said metallic spheres is made of a first metal which forms the center of said spheres and a second metal which is plated on the surface of said first metal.

5. A solder paste as claimed in claim 4, wherein said first metal is Cu and said second metal is Ni.

6. A solder paste as claimed in claim 1, wherein said solder paste portion comprises as Sn-Pb powdered solder and a solder paste flux.

7. A solder paste as claimed in claim 1, wherein said metallic spheres are of uniform diameter.

* * * * *